United States Patent
Hamanaka et al.

(10) Patent No.: US 10,186,378 B2
(45) Date of Patent: Jan. 22, 2019

(54) MULTILAYER CERAMIC CAPACITOR

(71) Applicant: Murata Manufacturing Co., Ltd., Nagaokakyo-shi, Kyoto-fu (JP)

(72) Inventors: Kenichi Hamanaka, Nagaokakyo (JP); Satoshi Matsuno, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/835,597

(22) Filed: Dec. 8, 2017

(65) Prior Publication Data

US 2018/0166215 A1 Jun. 14, 2018

(30) Foreign Application Priority Data

Dec. 9, 2016 (JP) ................................. 2016-239495
Jan. 27, 2017 (JP) ................................. 2017-013090

(51) Int. Cl.
| | | |
|---|---|---|
| *H01G 4/228* | (2006.01) | |
| *H01G 4/232* | (2006.01) | |
| *H01G 4/012* | (2006.01) | |
| *H01G 2/06* | (2006.01) | |
| *H01G 4/12* | (2006.01) | |
| *H01G 4/248* | (2006.01) | |
| *H05K 1/09* | (2006.01) | |
| *H01G 4/008* | (2006.01) | |
| *H01G 4/30* | (2006.01) | |
| *H05K 1/18* | (2006.01) | |

(52) U.S. Cl.
CPC ............... *H01G 4/012* (2013.01); *H01G 2/06* (2013.01); *H01G 2/065* (2013.01); *H01G 4/008* (2013.01); *H01G 4/12* (2013.01); *H01G 4/232* (2013.01); *H01G 4/248* (2013.01); *H01G 4/30* (2013.01); *H05K 1/09* (2013.01); *H05K 1/181* (2013.01); *H05K 2201/10015* (2013.01)

(58) Field of Classification Search
CPC ............................... H01G 4/228; H01G 4/232
See application file for complete search history.

(56) References Cited

U.S. PATENT DOCUMENTS

| | | | | |
|---|---|---|---|---|
| 2008/0130199 A1* | 6/2008 | Omura | ...................... | H01G 2/06 361/321.3 |
| 2011/0051314 A1* | 3/2011 | Sakurai | ................ | B23K 1/0016 361/321.1 |
| 2015/0279566 A1* | 10/2015 | Otani | ....................... | H01G 4/30 361/301.4 |

FOREIGN PATENT DOCUMENTS

JP          11-162771 A          6/1999

* cited by examiner

*Primary Examiner* — Eric Thomas
(74) *Attorney, Agent, or Firm* — Keating & Bennett, LLP

(57) ABSTRACT

A multilayer ceramic capacitor includes a laminate of ceramic layers and internal electrodes, and a pair of external electrodes located on both end surfaces of the laminate and electrically connected to the internal electrodes. Each of the pair of external electrodes includes an underlying electrode layer on the surface of the laminate and including Cu, a bonding portion partially provided on a surface of the underlying electrode layer and including a $Cu_3Sn$ alloy, and a conductive resin layer provided on surfaces of the underlying electrode layer and the bonding portion, and a total area of the bonding portion is not less than about 2.7% and not more than about 40.6% of a total area of the underlying electrode layer.

20 Claims, 2 Drawing Sheets

MULTILAYER CERAMIC CAPACITOR

CROSS REFERENCE TO RELATED APPLICATIONS

This application claims the benefit of priority to Japanese Patent Application No. 2017-013090 filed on Jan. 27, 2017 and Japanese Patent Application No. 2016-239495 filed on Dec. 9, 2016. The entire contents of these applications are hereby incorporated herein by reference.

BACKGROUND OF THE INVENTION

1. Field of the Invention

The present invention relates to a multilayer ceramic capacitor, and relates particularly to a multilayer ceramic capacitor including an external electrode including a multilayer structure.

2. Description of the Related Art

In recent years, multilayer ceramic capacitors have been used under a severe environment more susceptible to an impact than the prior art, so that the multilayer ceramic capacitors are required to have mechanical strength that can correspond to this. For example, multilayer ceramic capacitors for use in mobile devices such as cellular phones and portable music players are required to withstand impact such as dropping. Specifically, the multilayer ceramic capacitors are required to keep from dropping from mounting boards and keep themselves from being cracked, even when subjected to impact such as dropping. In addition, multilayer ceramic capacitors for use in vehicle-mounted devices such as ECU are required to withstand impact such as thermal cycling. Specifically, the multilayer ceramic capacitors are required to avoid being cracked even when subjected to deflection stress generated by linear expansion and contraction of the mounting boards in thermal cycling and a tensile stress applied to an external electrode.

For the purpose of responding to requirements as described above, a multilayer ceramic capacitor provided with an external electrode including a thermosetting resin layer is known. Japanese Patent Application Laid-Open No. 11-162771 discloses such a multilayer ceramic capacitor.

The multilayer ceramic capacitor of Japanese Patent Application Laid-Open No. 11-162771 is provided with an external electrode having a multilayer structure including electrode layers as baked electrodes formed on both end surfaces of a capacitor body and a conductive thermosetting resin layer formed on a surface of the electrode layer. In the multilayer ceramic capacitor of Japanese Patent Application Laid-Open No. 11-162771, the electrode layer has a function of ensuring moisture resistance reliability in the external electrode having the multilayer structure, and the thermosetting resin layer has a crack prevention function to the capacitor body.

Since a multilayer ceramic capacitor as disclosed in Japanese Patent Application Laid-Open No. 11-162771 contains a resin in the thermosetting resin layer, the content of a metal contained in the thermosetting resin layer is low. Thus, an adhesive force between the thermosetting resin layer and an electrode layer formed on a lower surface of the thermosetting resin layer tends to be weak. Consequently, the multilayer ceramic capacitor as disclosed in Japanese Patent Application Laid-Open No. 11-162771 has a problem that moisture or the like intrudes between the thermosetting resin layer and the electrode layer, and moisture resistance reliability and electrical characteristics are deteriorated.

As a method for solving the above problem, a measure exists to form an alloy layer between the electrode layer and the thermosetting resin layer. However, there has been a problem that if the amount of alloy between the electrode layer and the thermosetting resin layer is too large, a crack prevention function due to the thermosetting resin layer is deteriorated.

SUMMARY OF THE INVENTION

Preferred embodiments of the present invention provide multilayer ceramic capacitors that significantly improve mechanical strength provided by an external electrode and achieve high moisture resistance reliability and excellent electrical characteristics due to firm adhesion between an underlying electrode layer and a conductive resin layer included in the external electrode.

A multilayer ceramic capacitor according to a preferred embodiment of the present invention includes: a laminate including a stack of a plurality of ceramic layers and a plurality of internal electrodes; and a pair of external electrodes located on a surface of the laminate and electrically connected to the internal electrode. In this multilayer ceramic capacitor, each of the pair of external electrodes includes: an underlying electrode layer provided on the surface of the laminate and including Cu; a bonding portion partially provided on a surface of the underlying electrode layer and including a $Cu_3Sn$ alloy; and a conductive resin layer provided on surfaces of the underlying electrode layer and the bonding portion, and a total area of the bonding portion is not less than about 2.7% and not more than about 40.6% of a total area of the underlying electrode layer.

In a multilayer ceramic capacitor according to a preferred embodiment of the present invention, preferably, the bonding portion has a thickness of not less than about 0.1 μm and not more than about 1.2 μm.

In a multilayer ceramic capacitor according to a preferred embodiment of the present invention, preferably, the bonding portion includes a width of not less than about 1.3 μm and not more than about 13.3 μm.

In a multilayer ceramic capacitor according to a preferred embodiment of the present invention, preferably, the bonding portion includes an alloy layer including at least one of Ag and Cu and Sn.

A multilayer ceramic capacitor according to a preferred embodiment of the present invention is metal bonded in an external electrode including a multilayer structure with, located therebetween, the bonding portion partially provided on the surface of the underlying electrode layer and including a $Cu_3Sn$ alloy, and a total area of the bonding portion is not less than about 2.7% and not more than about 40.6% of the total area of the underlying electrode layer. Accordingly, the underlying electrode layer and the conductive resin layer included in the external electrode firmly adhere to each other, the moisture resistance reliability and the electrical characteristics are significantly improved, and occurrence of cracks in the multilayer ceramic capacitor is also able to be significantly reduced or prevented. In addition, since the external electrode includes the conductive resin layer, mechanical strength, for example, substrate bending resistance and dropping impact resistance is significantly improved. Accordingly, it is possible to provide a multilayer ceramic capacitor which significantly improves mechanical strength provided by an external electrode and includes high moisture resistance reliability and excellent electrical characteristics due to firm adhesion between an underlying electrode layer and a conductive resin layer included in the external electrode.

In a multilayer ceramic capacitor according to a preferred embodiment of the present invention, the bonding portion includes a thickness of not less than about 0.1 μm and not more than about 1.2 μm. As a result, occurrence of cracks in the multilayer ceramic capacitor is further significantly reduced or prevented, and the electrical characteristics are significantly improved.

The bonding portion includes a width of not less than about 1.3 μm and not more than about 13.3 μm. Accordingly, it is possible to more reliably significantly reduce or prevent occurrence of cracks in the multilayer ceramic capacitor.

In addition, in a multilayer ceramic capacitor according to a preferred embodiment of the present invention, when the bonding portion includes an alloy layer including at least one of Ag and Cu and Sn, it is possible to more reliably provide a multilayer ceramic capacitor with excellent electrical characteristics.

The preferred embodiments of the present invention are able to provide multilayer ceramic capacitors that significantly improve the mechanical strength provided by the external electrode and achieve high moisture resistance reliability and excellent electrical characteristics due to firm adhesion between the underlying electrode layer and the conductive resin layer included in the external electrode.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
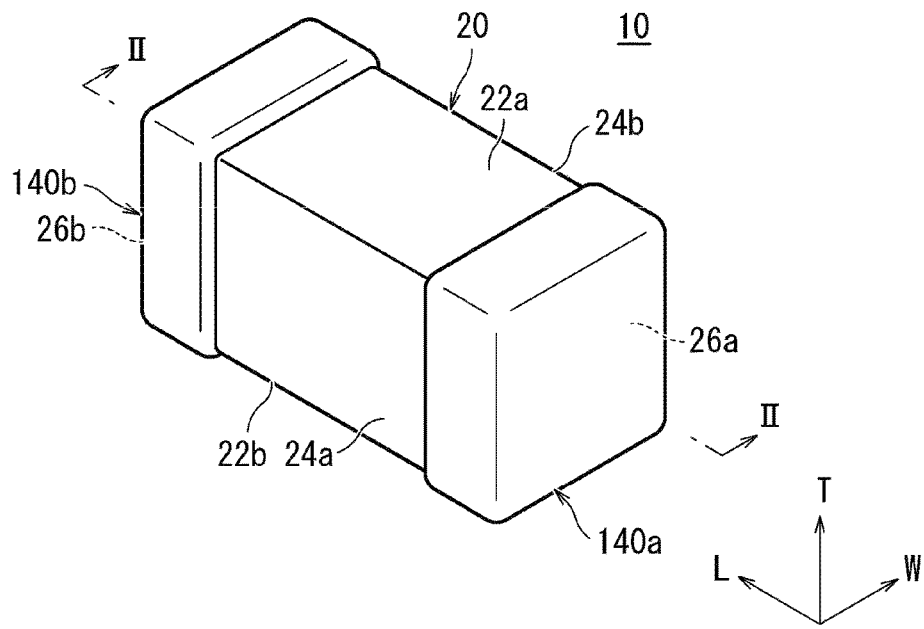
FIG. 1 is an external perspective view showing a multilayer ceramic capacitor according to a preferred embodiment of the present invention.
Figure 2:
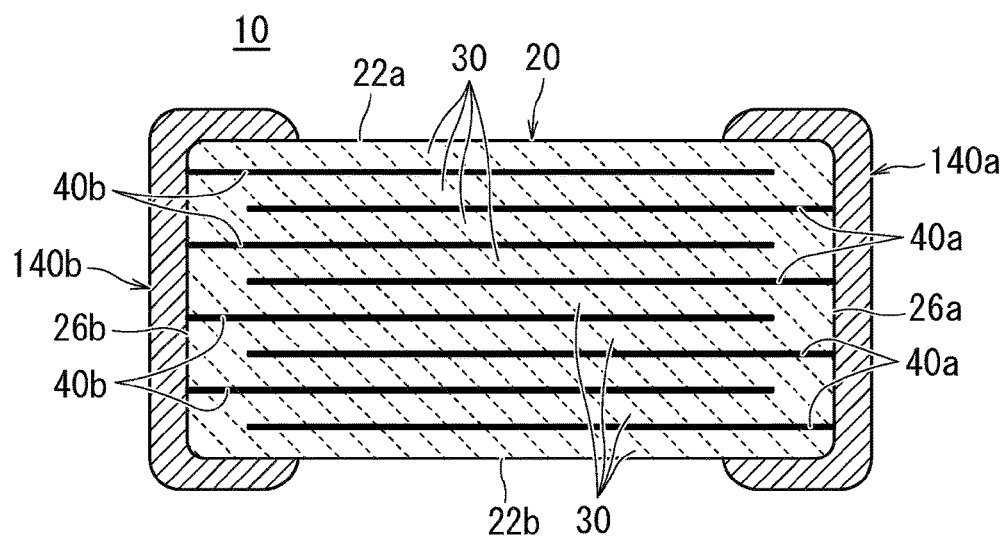
FIG. 2 is a cross-sectional view taken along a line II-II of FIG. 1.
Figure 3:
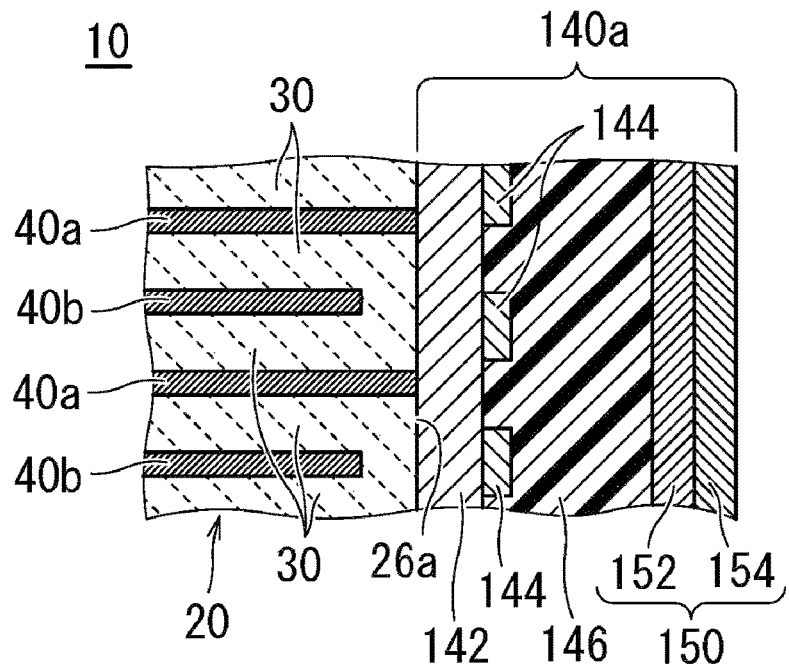
FIG. 3 is an enlarged view of a first external electrode and its vicinity in a cross-sectional view of FIG. 2.

Hereinafter, multilayer ceramic capacitors according to preferred embodiments of the present invention will be described with reference to the drawings. FIG. 1 is an external perspective view showing a multilayer ceramic capacitor according to a preferred embodiment of the present invention. FIG. 2 is a cross-sectional view taken along a line II-II of FIG. 1. FIG. 3 is an enlarged view of a first external electrode and its vicinity in a cross-sectional view of FIG. 2.

A multilayer ceramic capacitor 10 according to the present preferred embodiment includes a laminate 20, a first external electrode 140a and a second external electrode 140b (a pair of external electrodes).

The laminate 20 is provided preferably by stacking a plurality of ceramic layers 30, a plurality of first internal electrodes 40a, and a plurality of second internal electrodes 40b.

The laminate 20 includes a rectangular parallelepiped or substantially rectangular parallelepiped shape and includes first and second main surfaces 22a and 22b facing each other, first and second side surfaces 24a and 24b facing each other, and first and second end surfaces 26a and 26b facing each other. Here, a direction connecting the first end surface 26a and the second end surface 26b is a length (L) direction, a direction that is orthogonal or substantially orthogonal to the L direction and connects the first side surface 24a and the second side surface 24b is a width (W) direction, and a direction that is orthogonal or substantially orthogonal to the L direction and the W direction and connects the first main surface 22a and the second main surface 22b is a height (T) direction.

It is preferable that the laminate 20 is rounded at some or all of its corner portions and ridge portions. The rectangular parallelepiped or substantially rectangular parallelepiped shape of the laminate 20 is not particularly limited as long as it includes the first and second main surfaces 22a and 22b, the first and second side surfaces 24a and 24b, and the first and second end surfaces 26a and 26b. For example, in the laminate 20, differences in level or concavo-convex portions may be provided at a portion or the whole of the first and second main surfaces 22a and 22b, the first and second side surfaces 24a and 24b, and the first and second end surfaces 26a and 26b.

The ceramic layer 30 is sandwiched between the first internal electrode 40a and the second internal electrode 40b and stacked in the T direction. The thickness of the ceramic layer 30 is preferably approximately not less than about 0.5 μm and not more than about 10 μm, for example.

As the ceramic material of the ceramic layer 30, for example, a dielectric ceramic mainly including of $BaTiO_3$, $CaTiO_3$, $SrTiO_3$, $CaZrO_3$, or the like is able to be included.

Accessory components, for example, a Mn compound, an Fe compound, a Cr compound, a Co compound, and a Ni compound may be added to these main components.

The first internal electrode 40a includes a flat plate portion that extends at an interface of the ceramic layer 30 and is exposed at the first end surface 26a of the laminate 20. The second internal electrode 40b includes a flat plate portion that extends at the interface of the ceramic layer 30 to face the first internal electrode 40a with the ceramic layer 30 located therebetween, and is exposed at the second end surface 26b. Accordingly, the first and second internal electrodes 40a and 40b include counter portions, facing each other with the ceramic layer located therebetween, and extended portions extended to the first and second end surfaces 26a and 26b. The first internal electrode 40a and the second internal electrode 40b face each other with the ceramic layer 30 located therebetween to generate an electrostatic capacitance. The thickness of the first and second internal electrodes 40a and 40b is preferably approximately not less than about 0.2 μm and not more than about 2.0 μm, for example.

The first and second internal electrodes 40a and 40b preferably include a suitable conductive material, for example, a metal such as Ni, Cu, Ag, Pd, Au, an Ag—Pd alloy, or an alloy including at least one of these metals.

The first external electrode 140a is provided from the first end surface 26a of the laminate 20 to a portion of each of the first and second main surfaces 22a and 22b and a portion of each of the first and second side surfaces 24a and 24b and electrically connected to the first internal electrode 40a at the first end surface 26a. The second external electrode 140b is provided from the second end surface 26b of the laminate 20 to a portion of each of the first and second main surfaces 22a and 22b and a portion of each of the first and second side surfaces 24a and 24b and electrically connected to the second internal electrode 40b at the second end surface 26b.

The first and second external electrodes 140a and 140b include a multilayer structure including an underlying electrode layer 142, a bonding portion 144, a conductive resin layer 146, and a plating layer 150. The first and second external electrodes 140a and 140b may not include the plating layer 150.

It is preferable that the underlying electrode layer 142 is provided from one of the first and second end surfaces 26a and 26b of the laminate 20 to a portion of each of the first and second main surfaces 22a and 22b and a portion of each of the first and second side surfaces 24a and 24b. The underlying electrode layer 142 may be provided only on one of the first and second end surfaces 26a and 26b of the laminate 20. The thickness of the thickest portion of the underlying electrode layer 142 is preferably, for example, not less than about 10 μm and not more than about 50 μm.

The underlying electrode layer 142 is formed, for example, by applying and baking a conductive paste including a conductive metal and glass. As the conductive metal, for example, Cu, a Cu alloy, or the like is able to be included. As the glass, for example, glass including B, Si, Ba, Mg, Al, Li or the like is able to be included. The underlying electrode layer 142 may be formed by co-firing with the first and second internal electrodes 40a and 40b, or may be formed by applying and baking a conductive paste.

The bonding portion 144 is provided on a surface of the underlying electrode layer 142 to partially cover the underlying electrode layer 142. Specifically, it is preferable that the bonding portion 144 is provided on a surface of the underlying electrode layer 142 located on one of the first and second end surfaces 26a and 26b of the laminate 20, and extends to reach a surface of the underlying electrode layer 142 defined therefrom to a portion of each of the first and second main surfaces 22a and 22b and a portion of each of the first and second side surfaces 24a and 24b. The bonding portion 144 may be provided only on the surface of the underlying electrode layer 142 located on one of the first and second end surfaces 26a and 26b of the laminate 20.

A surface of the bonding portion 144 may be roughened. Specifically, a value of surface roughness Ra of the bonding portion 144 is preferably not less than about 0.2 μm and not more than about 5.1 μm, for example. When the value of the surface roughness Ra of the bonding portion 144 is less than about 0.2 μm, for example, interface peeling between the bonding portion 144 and the conductive resin layer 146 tends to occur. When the value of the surface roughness Ra of the bonding portion 144 is more than about 5.1 μm, for example, an adhesion area of the conductive resin layer 146 becomes too small, and the interface peeling likewise tends to occur.

The bonding portion 144 includes a $Cu_3Sn$ alloy. Further, the bonding portion 144 may include an alloy including at least one of Ag and Cu and Sn. The atomic ratio Cu:Sn (atom %) of the bonding portion 144 is not less than 70 and not more than 80 atom %:not less than 20 and not more than 30 atom %, for example. In a heat treatment process to manufacture the multilayer ceramic capacitor 10, the $Cu_3Sn$ alloy of the bonding portion 144 and the alloy including at least one of Ag and Cu and Sn are provided by reacting Cu included in the underlying electrode layer 142 with the alloy including at least one of Ag and Cu and Sn included in the conductive resin layer 146.

That is, the underlying electrode layer 142 and the conductive resin layer 146 are metal bonded with the bonding portion 144 located therebetween.

The total area of the bonding portion 144 is not less than about 2.7% and not more than about 40.6% of the total area of the underlying electrode layer 142, for example. The thickness of the bonding portion 144 is preferably not less than about 0.1 μm and not more than about 1.2 μm, for example. Further, the width of the bonding portion 144 is preferably not less than about 1.3 μm and not more than about 13.3 μm, for example. If the thickness of the bonding portion 144 is less than about 0.1 μm, for example, since the $Cu_3Sn$ alloy is not sufficiently provided, the metal bonding becomes incomplete, and an adhesive force between the underlying electrode layer 142 and the conductive resin layer 146 becomes weak. If the bonding portion 144 does not exist at all, the underlying electrode layer 142 and the conductive resin layer 146 are not metal bonded, and the adhesive force between the underlying electrode layer 142 and the conductive resin layer 146 becomes weak. Accordingly, the electrical characteristics are not stabilized, and sufficient moisture resistance reliability is not able to be provided. Even if the width of the bonding portion 144 is less than about 1.3 μm and the total area of the bonding portion 144 is less than about 2.7% of the total area of the underlying electrode layer 142, for example, the metal bonding becomes incomplete, and the adhesive force between the underlying electrode layer 142 and the conductive resin layer 146 becomes weak. Accordingly, the electrical characteristics are not stabilized, and sufficient moisture resistance reliability is not able to be provided.

If the thickness of the bonding portion 144 exceeds about 1.2 μm, the width of the bonding portion 144 exceeds about 13.3 μm, and the total area of the bonding portion 144 exceeds about 40.6% of the total area of the underlying electrode layer, for example, when stress is generated in the first and second external electrodes 140a and 140b by external force, the stress is not able to be relaxed, and a prevention cracking due to the conductive resin layer 146 is deteriorated.

Figure 4:
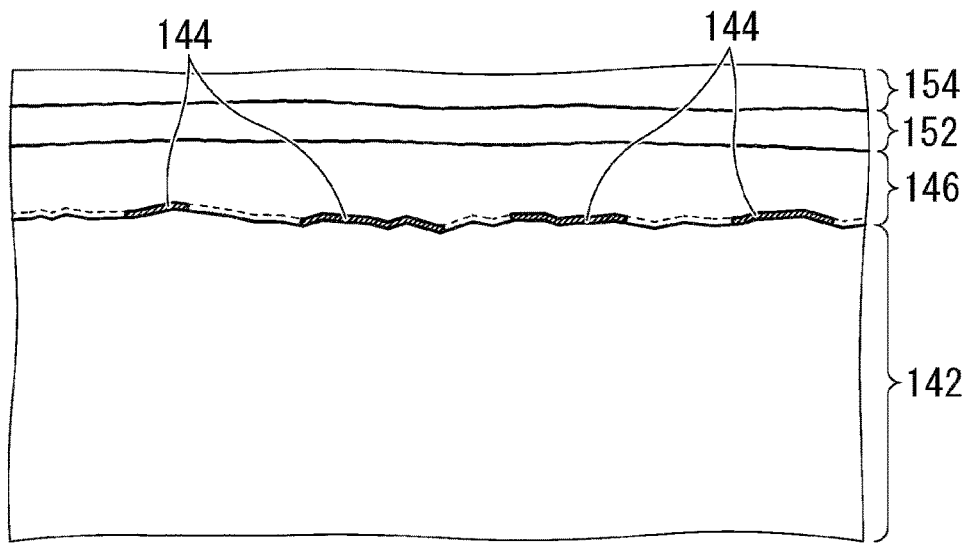
FIG. 4 is a diagram schematically showing a SEM image showing a bonding portion included in an external electrode.

The total area, thickness and width of the bonding portion 144 are measured in an exposed cross-sectional surface which has been cross-section polished to an about ½ position (W/2 position) in a width direction of the above-described multilayer ceramic capacitor and has been enlarged to a predetermined magnification as shown in FIG. 4. The following measurement methods were applied.

First, for the total area of the bonding portion 144, at a central position (T/2 position) of the exposed cross-sectional surface, in a region where the bonding portion exists, a ratio of existence of the bonding portion to the length of the underlying electrode layer 142 capable of being confirmed in a view field of a SEM image of the exposed cross-sectional surface enlarged to a predetermined magnification is measured as the total area of the bonding portion 144.

For the thickness of the bonding portion 144, at the central position (T/2 position) of the exposed cross-sectional surface, in the region where the bonding portion exists, a thickness along a vertical direction with respect to a tangent of an interface with the underlying electrode layer 142 capable of being confirmed in a view field of a SEM image of the exposed cross-sectional surface enlarged to a predetermined magnification is measured as the thickness of the bonding portion 144.

For the width of the bonding portion 144, at the central position (T/2 position) of the exposed cross-sectional surface, in the region where the bonding portion exists, a maximum length of the bonding portion capable of being confirmed in a view field of a SEM image of the exposed cross-sectional surface enlarged to a predetermined magnification is measured as the width of the bonding portion 144.

The conductive resin layer 146 is provided on the surfaces of the underlying electrode layer 142 and the bonding portion 144 to cover the underlying electrode layer 142 and the bonding portion 144. Specifically, it is preferable that the conductive resin layer 146 is provided on the surface of the bonding portion 144 located on one of the first and second end surfaces 26a and 26b of the laminate 20, and extends to reach the surface of the bonding portion 144 defined therefrom to a portion of each of the first and second main surfaces 22a and 22b and a portion of each of the first and second side surfaces 24a and 24b. The thickness of the conductive resin layer 146 is preferably, for example, not less than about 10 μm and not more than about 150 μm.

The conductive resin layer 146 includes a conductive filler and a resin.

The shape of the grains of the conductive filler may be spherical or substantially spherical, flattened, or the like. When the shape of the grains of the conductive filler is spherical or substantially spherical, flattened, or the like, it is preferable to include a mixture of spherical or substantially spherical grains and flattened grains. The shape of the grains of the conductive filler is not particularly limited.

Although an average grain size of the conductive filler may be, for example, not less than about 0.3 μm and not more than about 10 μm, it is not particularly limited.

As the conductive filler, a metal that is conductive is able to be included, and for example, Cu, Ag, and Sn, or an alloy including these metals is able to be included. In particular, Cu, Ag, and Sn, or the alloy including these metals, are included in the bonding portion 144 including the $Cu_3Sn$ alloy or an alloy of Ag, Cu and Sn.

The conductive filler is mainly responsible for the conductivity of the conductive resin layer 146. Specifically, the conductive fillers are in contact with each other, and thus a conductive path is defined inside the conductive resin layer 146.

As the resin included in the conductive resin layer 146, it is possible to include thermosetting resins, for example, epoxy resin, phenol resin, urethane resin, silicone resin, and polyimide resin. In particular, the epoxy resin is preferably included as the resin included in the conductive resin layer 146. The epoxy resins are excellent in heat resistance, moisture resistance, adhesion, and so on and are one of the most suitable resins. The conductive resin layer 146 preferably includes a curing agent together with the thermosetting resin. When an epoxy resin is included as the thermosetting resin, compounds, for example, phenol type, amine type, acid anhydride type, and imidazole type compounds are able to be included as curing agents.

Since the conductive resin layer 146 includes a resin, it is more flexible than a conductive layer including a baked material of a plating film or a conductive paste, for example. Accordingly, the conductive resin layer 146 defines and functions as a layer that buffers a physical shock applied to the multilayer ceramic capacitor 10 and an impact caused by thermal cycling. Accordingly, it is possible to significantly reduce or prevent occurrence of cracks or the like in the multilayer ceramic capacitor 10. That is, the multilayer ceramic capacitor 10 is provided with the conductive resin layer 146, thus significantly improving mechanical strength, for example, substrate bending resistance and dropping impact resistance.

The plating layer 150 is provided on the surface of the conductive resin layer 146 to cover the conductive resin layer 146. Specifically, it is preferable that the plating layer 150 is provided on the surface of the conductive resin layer 146 located on one of the first and second end surfaces 26a and 26b of the laminate 20, and extends to reach the surface of the conductive resin layer 146 defined therefrom to a portion of each of the first and second main surfaces 22a and 22b and a portion of each of the first and second side surfaces 24a and 24b. The plating layer 150 may be provided only on the surface of the conductive resin layer 146 located on one of the first and second end surfaces 26a and 26b of the laminate 20.

The plating layer 150 includes at least one selected from Cu, Ni, Sn, Ag, Pd, Ag—Pd alloy, Au, and the like.

The plating layer 150 includes a two-layer structure including a first plating layer 152 and a second plating layer 154. The plating layer 150 may include a single layer structure including only the first plating layer 152 or a multilayer structure of three or more layers. The thickness per layer of the plating layers 150 is preferably not less than about 1 μm and not more than about 15 μm, for example.

The first plating layer 152 is provided on the surface of the conductive resin layer 146 to cover the conductive resin layer 146. The first plating layer 152 is preferably a nickel plating layer. Accordingly, it is possible to significantly reduce or prevent the underlying electrode layer 142 and the conductive resin layer 146 from being eroded by solder that mounts the multilayer ceramic capacitor 10 on a mounting substrate. The first plating layer 152 may include a multilayer structure.

The second plating layer 154 is provided on the surface of the first plating layer 152 to cover the first plating layer 152.

The second plating layer 154 is preferably a tin plating layer. Accordingly, it is possible to significantly improve wettability of solder to the external electrodes 140a and 140b when the multilayer ceramic capacitor 10 is mounted on the mounting substrate. Accordingly, the multilayer ceramic capacitor 10 is able to be easily mounted.

In the multilayer ceramic capacitor 10 according to the present preferred embodiment, in the external electrodes 140a and 140b including a multilayer structure, the underlying electrode layer 142 and the conductive resin layer 146 are metal bonded with, located therebetween, the bonding portion 144 which includes the $Cu_3Sn$ alloy and may include the alloy of Ag, Cu and Sn, and the total area of the bonding portion is not less than about 2.7% and not more than about 40.6% of the total area of the underlying electrode layer, for example. Accordingly, the underlying electrode layer 142 and the conductive resin layer 146 included in the external electrodes 140a and 140b firmly adhere to each other, the moisture resistance reliability and the electrical characteristics are significantly improved, and occurrence of cracks in the multilayer ceramic capacitor is also able to be significantly reduced or prevented. In addition, since the external electrodes 140a and 140b each include the conductive resin layer 146, the mechanical strength, for example, substrate bending resistance and dropping impact resistance is significantly improved. Accordingly, the multilayer ceramic capacitor 10 significantly improves the mechanical strength by the external electrodes 140a and 140b and includes high moisture resistance reliability and excellent electrical characteristics due to firm adhesion between the underlying electrode layer 142 and the conductive resin layer 146 included in the external electrodes 140a and 140b.

Further, in the multilayer ceramic capacitor 10 according to the present preferred embodiment, when the thickness of the bonding portion 144 is not less than about 0.1 μm and not more than about 1.2 μm, for example, while occurrence of cracks in the multilayer ceramic capacitor is significantly reduced or prevented, the electrical characteristics are also significantly improved. When the width of the bonding portion 144 is not less than about 1.3 μm and not more than about 13.3 μm, for example, occurrence of cracks in the multilayer ceramic capacitor is able to be more reliably significantly reduced or prevented.

Furthermore, in the multilayer ceramic capacitor 10 according to the present preferred embodiment, when the bonding portion 144 includes an alloy layer including at least one of Ag and Cu and Sn, it is possible to more reliably provide the multilayer ceramic capacitor 10 with excellent electrical characteristics.

Subsequently, a method of manufacturing a multilayer ceramic capacitor will be described.

First, a ceramic paste including a ceramic powder is applied in the shape of a sheet by screen printing or the like, for example, and dried to form a ceramic green sheet.

Then, a conductive paste for internal electrode formation is applied onto a surface of the ceramic green sheet in a predetermined pattern by screen printing or the like, for example, to provide a ceramic green sheet on which a conductive pattern for internal electrode formation is formed. In addition, a ceramic green sheet including no conductive pattern for internal electrode formation is also provided. The ceramic paste and the conductive paste for internal electrode formation may include, for example, a binder or solvent.

Then, a predetermined number of the ceramic green sheets including no conductive pattern for internal electrode formation are stacked, the ceramic green sheet on which the conductive pattern for internal electrode formation is formed is stacked on the surface thereof, and a predetermined number of the ceramic green sheets including no conductive pattern for internal electrode formation are stacked on the surface thereof. In this way, a mother laminate is produced.

The mother laminate may be pressed in the stacking direction, for example. As a method of pressing the mother laminate, isostatic pressing or the like may be adopted, for example.

The mother laminate is cut in a predetermined shape dimension to provide a plurality of green laminates. At this time, barrel polishing or the like may be applied to the green laminate to round the ridgeline portions or the corner portions.

Finally, the green laminate is fired to provide a laminate in which the first and second internal electrodes are included inside, an end portion of the first internal electrode is extended to the first end surface, and an end portion of the second internal electrode is extended to the second end surface. The firing temperature of the green laminate is able to be appropriately set depending on the ceramic material and the conductive material. The firing temperature of the green laminate is able to be set to, for example, approximately not less than about 900° C. and not more than about 1300° C.

First, a conductive paste is applied and baked to both end surfaces of the laminate as described above to provide an underlying electrode layer of the external electrode. The baking temperature at this time is preferably not less than about 700° C. and not more than about 900° C., for example.

Then, a conductive filler including at least Sn and a conductive resin paste including a resin are applied to cover the underlying electrode layer, and heat treatment is performed at a maximum temperature of not less than about 200° C. and not more than about 300° C. to thermoset the resin. The maximum temperature during the heat treatment is preferably not less than about 240° C. and not more than about 260° C., for example. In this case, the content of Sn in the conductive resin paste is preferably not less than about 10 wt % and not more than about 40 wt %, for example. In this way, a conductive resin layer is provided and covers the underlying electrode layer. At this time, the bonding portion is partially formed on the surface of the underlying electrode layer. The thickness and width of the bonding portion are able to be adjusted by changing the maximum temperature during heat treatment and the heat treatment time. In the present preferred embodiment, the thickness and width of the bonding portion are adjusted by changing the maximum temperature during the heat treatment.

Specifically, the thickness and width of the bonding portion are able to be reduced by decreasing the maximum temperature during the heat treatment, and conversely the thickness and width are able to be increased by increasing the maximum temperature during the heat treatment.

The atmosphere during the heat treatment is preferably an $N_2$ atmosphere. Also, it is preferable to reduce the oxygen concentration to not more than about 100 ppm, for example. Accordingly, scattering of the resin is able to be significantly reduced or prevented, and oxidation of various metal components is able to be significantly reduced or prevented.

Then, a nickel plating layer (first plating layer) may be formed on a surface of the conductive resin layer, for example. As a method of forming the nickel plating layer, electrolytic plating is able to be applied.

A tin plating layer (second plating layer) may be formed on a surface of the nickel plating layer (first plating layer), for example.

As described above, the multilayer ceramic capacitor according to the present preferred embodiment is manufactured.

Hereinafter, experimental examples conducted by the inventors to confirm the effects of the preferred embodiments of the present invention will be described. In the experimental examples, samples Nos. 1 to 20 were produced according to the above-described method of manufacturing the multilayer ceramic capacitor, and the mechanical strength and the electrical characteristics were evaluated.

Specifications of multilayer ceramic capacitors as the samples Nos. 1 to 20 are as follows.

Size (design value) L×W×T: about 1.6 mm×about 0.8 mm×about 0.8 mm

Ceramic material: $BaTi_2O_3$

Electrostatic capacitance: about 22 μF

Rated voltage: about 6.3 V

Structure of external electrode: a multilayer structure including an underlying electrode layer, a conductive resin layer, and a plating layer is adopted, and a bonding portion is partially provided on a surface of the underlying electrode layer Underlying electrode layer: baked electrode including conductive metal (Cu) and glass Bonding portion: alloy of Cu and Sn Conductive resin layer: conductive filler including Ag and Sn, and resin including resol type phenol resin-based resin Structure of plating layer: two-layer structure including nickel plating layer (first plating layer) and tin plating layer (second plating layer)

Heat treatment conditions: about 18 min, $N_2$ atmosphere

In the samples Nos. 1 to 20, the content of Sn in a conductive resin paste that forms the conductive resin layer and the maximum temperature of a curing temperature for thermosetting the conductive resin paste were varied, respectively.

In the samples Nos. 1 to 5, the maximum temperature of the curing temperature was about 240° C., and the Sn content was varied from about 0 wt % to about 40 wt %.

In the samples Nos. 6 to 10, the maximum temperature of the curing temperature was about 260° C., and the Sn content was varied from about 0 wt % to about 40 wt %.

In the samples Nos. 11 to 15, the maximum temperature of the curing temperature was about 280° C., and the Sn content was varied from about 0 wt % to about 40 wt %.

In the samples Nos. 16 to 20, the maximum temperature of the curing temperature was about 300° C., and the Sn content was varied from about 0 wt % to about 40 wt %.

The mechanical strength and electrical characteristics of the samples Nos. 1 to 20 were evaluated.

The test on the mechanical strength was carried out as follows. Reflow mounting was performed with lead-free solder (Sn-3.0Ag-0.5Cu) on a JEITA land substrate. The substrate was deflected by about 1 mm per second and held for about 5 seconds at a deflection of about 5 mm. Thereafter, a chip was removed from the substrate, embedded in resin, and cross-section polished to an about ½ position (W/2 position) in a width direction dimension of the multilayer ceramic capacitor along the length direction of the multilayer ceramic capacitor. The presence or absence of cracks at an edge of the underlying electrode layer at an exposed cross-sectional surface was observed, and the number of occurrences of cracks was counted. The number of samples for evaluation of the mechanical strength was 12.

The test on the electrical characteristics was carried out as follows. For each sample, an electric characteristic test was carried out by scanning with a voltage of about 1 Vrms and a frequency of about 1 kHz to about 10 MHz by an impedance analyzer (4294A manufactured by Agilent Technologies, Inc.), and ESR at about 1 MHz was measured. As a test fixture, 16044A manufactured by Agilent Technologies, Inc. was used. A sample with an average of not more than about 15 mΩ was judged as being good. The number of samples to be evaluated in the electric characteristic test was 10.

A method of analyzing whether a bonding portion is included in the external electrode of each of the multilayer ceramic capacitors as the samples Nos. 1 to 20 is as follows. A multilayer ceramic capacitor was randomly selected, embedded in resin, and cross-section polished to an approximately ½ position (W/2 position) in the width direction of the multilayer ceramic capacitor along the length direction of the multilayer ceramic capacitor. Thereafter, at an exposed cross-sectional surface, the presence or absence of the bonding portion in the external electrode at a central portion of an end surface of the multilayer ceramic capacitor was observed at a predetermined magnification by FE-SEM.

The total area, thickness and width of the bonding portion were measured in an exposed cross-sectional surface which was cross-section polished to the about ½ position (W/2 position) in the width direction of the above-described multilayer ceramic capacitor. The following measurement method was applied.

First, for the total area of the bonding portion, at a central position (T/2 position) of the exposed cross-sectional surface, in a region where the bonding portion existed, a ratio of existence of the bonding portion to the length of the underlying electrode layer capable of being confirmed in a view field of a SEM image of the exposed cross-sectional surface enlarged to a predetermined magnification was measured as the total area of the bonding portion and calculated as an average of three samples.

For the thickness of the bonding portion, at the central position (T/2 position) of the exposed cross-sectional surface, in the region where the bonding portion existed, a thickness along a vertical direction with respect to a tangent of an interface with the underlying electrode layer capable of being confirmed in a view field of a SEM image of the exposed cross-sectional surface enlarged to a predetermined magnification was measured as the thickness of the bonding portion and calculated as an average of three samples.

For the width of the bonding portion, at the central position (T/2 position) of the exposed cross-sectional surface, in the region where the bonding portion existed, a maximum length of the bonding portion capable of being confirmed in a view field of a SEM image of the exposed cross-sectional surface enlarged to a predetermined magnification was measured as the width of the bonding portion and calculated as an average of three samples.

Table 1 shows the evaluation results of mechanical strength characteristics of each of the samples Nos. 1 to 20.

TABLE 1

| | | Sn content (wt %) | Curing temperature (° C.) | Bonding portion Total area (%) | Thickness (μm) | Width (μm) | Incidence of cracks (%) | ESR mΩ |
|---|---|---|---|---|---|---|---|---|
| Sample No. | 1 | 0 | 240 | 0 | 0 | 0 | 0 | 35.2 |
| | 2 | 10 | 240 | 2.7 | 0.1 | 1.3 | 0 | 5.4 |
| | 3 | 20 | 240 | — | — | — | 0 | 5.4 |
| | 4 | 30 | 240 | — | — | — | 0 | 6.5 |
| | 5 | 40 | 240 | — | — | — | 0 | 5.7 |
| | 6 | 0 | 260 | 0 | 0 | 0 | 0 | 20.1 |
| | 7 | 10 | 260 | — | — | — | 0 | 5.5 |
| | 8 | 20 | 260 | — | — | — | 0 | 5.6 |
| | 9 | 30 | 260 | — | — | — | 0 | 6.2 |
| | 10 | 40 | 260 | 40.6 | 1.2 | 13.3 | 0 | 5.3 |
| | 11 | 0 | 280 | 0 | 0 | 0 | 0 | 18.2 |
| | 12 | 10 | 280 | — | — | — | 0 | 5.3 |
| | 13 | 20 | 280 | — | — | — | 0 | 5.2 |
| | 14 | 30 | 280 | — | — | — | 0 | 5.8 |
| | 15 | 40 | 280 | 58.8 | 1.8 | 27.7 | 8.3 | 4.9 |
| | 16 | 0 | 300 | 0 | 0 | 0 | 0 | 15.4 |
| | 17 | 10 | 300 | — | — | — | 0 | 4.4 |
| | 18 | 20 | 300 | — | — | — | 0 | 5.1 |
| | 19 | 30 | 300 | — | — | — | 0 | 6.0 |
| | 20 | 40 | 300 | 81.9 | 2.6 | 41.6 | 75 | 5.1 |

As shown in Table 1, in the samples Nos. 1 to 10, the Sn content was not less than about 0 wt % and not more than about 40 wt %, and the maximum temperature of the curing temperature was not less than about 240° C. and not more than about 260° C.; therefore, there was no sample in which cracks occurred.

In the samples Nos. 11 to 14, the Sn content was not less than about 0 wt % and not more than about 30 wt %, and the maximum temperature of the curing temperature was about 280° C.; therefore, there was no sample in which cracks occurred.

In the samples Nos. 16 to 19, the Sn content was not less than about 0 wt % and not more than about 30 wt %, and the maximum temperature of the curing temperature was about 300° C.; therefore, there was no sample in which cracks occurred.

In the sample No. 15, the maximum temperature of the curing temperature was about 280° C., and the Sn content was about 40 wt %; therefore, the total area of the bonding portion was about 58.8%, the thickness of the bonding portion was about 1.8 μm, and the width of the bonding portion was about 27.7 µm. Thus, cracks occurred in one of 12 samples, and the incidence of cracks was about 8.3%.

In the sample No. 20, the maximum temperature of the curing temperature was about 300° C., and the Sn content was about 40 wt %; therefore, the total area of the bonding portion was about 81.9%, the thickness of the bonding portion was about 2.6 µm, and the width of the bonding portion was about 41.6 µm. Thus, cracks occurred in 9 of 12 samples, and the incidence of cracks was about 75%.

Then, the ESR of each sample was confirmed. In the samples Nos. 1, 6, 11, and 16, since Sn was not included in the conductive resin paste, no bonding portion exists, and relatively high ESR was provided.

In the samples Nos. 2 to 5, 7 to 10, 12 to 15, and 17 to 20, since Sn was included in the conductive resin paste, a multilayer ceramic capacitor with ESR lower than that of the samples Nos. 1, 6, 11, and 16 including no bonding portion was provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
   a laminate including a stack of a plurality of ceramic layers and a plurality of internal electrodes; and
   a pair of external electrodes provided on a surface of the laminate and electrically connected to the internal electrode; wherein
   each of the pair of external electrodes includes:
   an underlying electrode layer partially provided on the surface of the laminate and including Cu;
   a bonding portion provided on a surface of the underlying electrode layer and including a $Cu_3Sn$ alloy; and
   a conductive resin layer provided on surfaces of the underlying electrode layer and the bonding portion; and
   a total area of the bonding portion is not less than about 2.7% and not more than about 40.6% of a total area of the underlying electrode layer.

2. The multilayer ceramic capacitor according to claim 1, wherein the bonding portion includes a thickness of not less than about 0.1 µm and not more than about 1.2 µm.

3. The multilayer ceramic capacitor according to claim 1, wherein the bonding portion includes a width of not less than about 1.3 µm and not more than about 13.3 µm.

4. The multilayer ceramic capacitor according to claim 1, wherein the bonding portion includes an alloy including Sn and at least one of Ag and Cu.

5. The multilayer ceramic capacitor according to claim 4, wherein the $Cu_3Sn$ alloy and the alloy including Sn and at least one of Ag and Cu of the bonding portion are provided by reacting Cu included in the underlying electrode layer with the alloy including Sn and at least one of Ag and Cu.

6. The multilayer ceramic capacitor according to claim 1, wherein the plurality of internal electrodes includes a plurality of first internal electrodes and a plurality of second internal electrodes.

7. The multilayer ceramic capacitor according to claim 6, wherein the plurality of first internal electrodes and the plurality of second internal electrodes alternate with one another in a stacking direction of the laminate with at least one of the plurality of ceramic layers included therebetween.

8. The multilayer ceramic capacitor according to claim 6, wherein the pair of external electrodes includes a first external electrode electrically connected to the first plurality of internal electrodes and a second external electrode electrically connected to the second plurality of internal electrodes.

9. The multilayer ceramic capacitor according to claim 1, wherein the underlying electrode layer is provided on one of a first end surface and a second end surfaces of the laminate and on a portion of each of a first main surface, a second main surface, a first side surface, and a second side surface of the laminate.

10. The multilayer ceramic capacitor according to claim 1, wherein the underlying electrode layer includes a conductive metal and a glass.

11. The multilayer ceramic capacitor according to claim 1, wherein the bonding portion is provided on one of a first end surface and a second end surfaces of the laminate and on a portion of each of a first main surface, a second main surface, a first side surface, and a second side surface of the laminate.

12. The multilayer ceramic capacitor according to claim 1, wherein a value of surface roughness of the bonding portion is not less than about 0.2 µm and not more than about 5.1 µm.

13. The multilayer ceramic capacitor according to claim 1, wherein an atomic ratio Cu:Sn (atom %) of the bonding portion is not less than 70 and not more than 80 atom %:not less than 20 and not more than 30 atom %.

14. The multilayer ceramic capacitor according to claim 1, wherein the conductive resin layer is provided on one of a first end surface and a second end surfaces of the laminate and on a portion of each of a first main surface, a second main surface, a first side surface, and a second side surface of the laminate.

15. The multilayer ceramic capacitor according to claim 1, wherein a thickness of the conductive resin layer is not less than about 10 µm and not more than about 150 µm.

16. The multilayer ceramic capacitor according to claim 1, wherein the conductive resin layer includes a conductive filler and a resin.

17. The multilayer ceramic capacitor according to claim 16, wherein an average grain size of the conductive filler is not less than about 0.3 µm and not more than about 10 µm.

18. The multilayer ceramic capacitor according to claim 1, wherein each of the pair of external electrodes includes a plating layer that at least partially covers the conductive resin layer.

19. The multilayer ceramic capacitor according to claim 18, wherein the plating layer is provided on one of a first end surface and a second end surfaces of the laminate and on a portion of each of a first main surface, a second main surface, a first side surface, and a second side surface of the laminate.

20. The multilayer ceramic capacitor according to claim 18, wherein the plating layer includes a two-layer structure of nickel and tin.

* * * * *